United States Patent
Bradski et al.

(10) Patent No.: US 7,154,157 B2
(45) Date of Patent: Dec. 26, 2006

(54) STACKED SEMICONDUCTOR RADIATION SENSORS HAVING COLOR COMPONENT AND INFRARED SENSING CAPABILITY

(75) Inventors: Gary R. Bradski, Palo Alto, CA (US); Horst Haussecker, Palo Alto, CA (US); Cynthia S. Bell, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 844 days.

(21) Appl. No.: 10/334,485

(22) Filed: Dec. 30, 2002

(65) Prior Publication Data

US 2004/0125222 A1    Jul. 1, 2004

(51) Int. Cl.
*H01L 31/00* (2006.01)

(52) U.S. Cl. ................ 257/440; 257/461; 257/465; 257/E27.134; 257/E27.135

(58) Field of Classification Search ........... 257/440
See application file for complete search history.

(56) References Cited

U.S. PATENT DOCUMENTS

| | | | |
|---|---|---|---|
| 4,238,760 A | | 12/1980 | Carr |
| 4,651,001 A | * | 3/1987 | Harada et al. ............ 250/330 |
| 4,677,289 A | * | 6/1987 | Nozaki et al. ............ 250/226 |
| 5,965,875 A | | 10/1999 | Merrill |
| 6,198,147 B1 | | 3/2001 | Connolly |
| 2002/0008191 A1 | * | 1/2002 | Faska et al. ............ 250/208.1 |
| 2004/0046885 A1 | * | 3/2004 | Regan et al. ........... 348/333.11 |

OTHER PUBLICATIONS

Lange, Robert and Seitz, Peter, "Solid-State Time-of-Flight Range Camera", IEEE Journal of Quantum Electronics, IEEE Inc. New York, US, vol. 37, No. 3, Mar. 2001, XP001086832, ISSN: 0018-9197, pp. 390-397.

"PCT Notification of Transmittal of the International Search Report or the Declaration", dated May 26, 2004 for PCT/US03/39691, 7pgs.

* cited by examiner

*Primary Examiner*—Tu-Tu Ho
(74) *Attorney, Agent, or Firm*—Buckley, Maschoff & Talwalkar LLC

(57) ABSTRACT

A radiation sensing structure includes red, green and blue photodiodes stacked Above an infrared radiation sensing photodiode.

14 Claims, 4 Drawing Sheets

STACKED SEMICONDUCTOR RADIATION SENSORS HAVING COLOR COMPONENT AND INFRARED SENSING CAPABILITY

BACKGROUND

A variety of video special effects can be enhanced or made possible by using a video camera that captures depth information in addition to color component information. The "ZCam"™ product able from 3DV Systems, Santa Clara, Calif., is a module that can be added on to a conventional studio video camera to provide depth information for objects in a scene captured by the video camera. The ZCam add-on relies on a sensing array that is separate from the color sensing circuit and thus entails a high cost. It could also be contemplated to integrate depth information pixels in arrays of red, green and blue pixels, but this also entails additional costs. That is, a camera which included an array or red, green, blue and depth pixels would have less density and hence less resolution and thereby higher cost for a given number of color pixels. In addition, the alignment problem that is generally encountered with R,G,B arrays is exacerbated because the interpolation routine for turning spatially separate R,G,B pixels into a single "RGB" pixel must also contend with an additional pixel for depth information.

DETAILED DESCRIPTION

Figure 1:
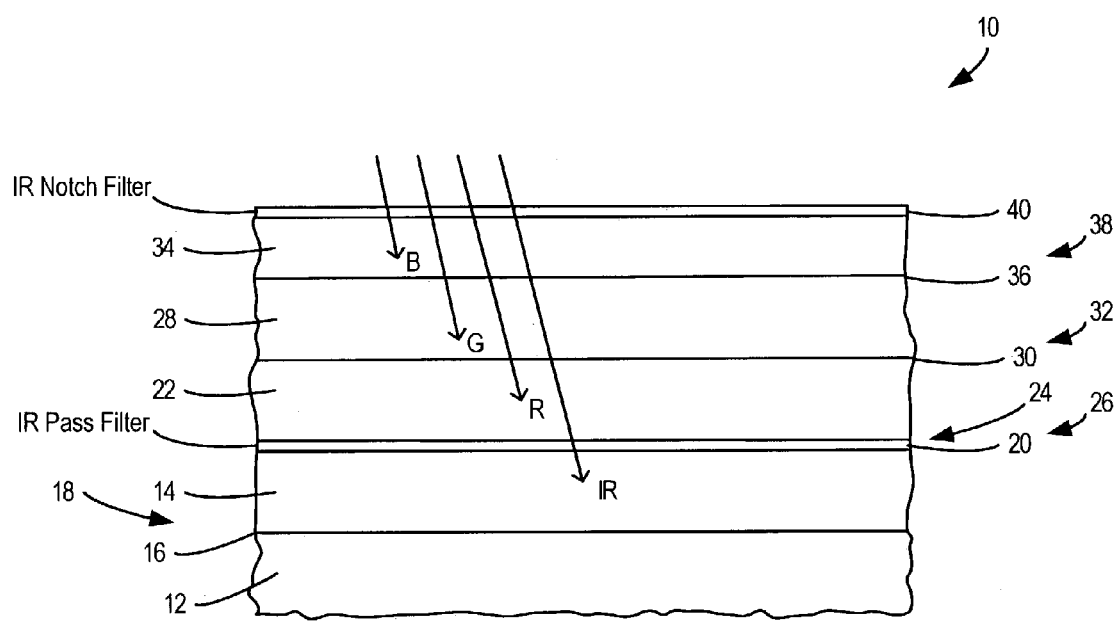
FIG. 1 is a schematic cross-sectional view of a visible and infrared radiation sensing structure according to some embodiments.

FIG. 1 is a schematic cross-sectional view of a sensing structure, in particular a stacked-diode visible and infrared radiation sensor, provided according to some embodiments. The sensing structure 10 is formed on a semiconductor substrate 12 of a first conductivity type, such as a silicon substrate of P-type conductivity. The substrate region 12 shown in FIG. 1 may, but need not, be a doped epi-layer on a silicon substrate. Overlying the region 12 is a region or layer 14 of second conductivity type, such as an N-doped region, to form a junction 16. The junction 16 is at a depth in the structure 10 that substantially corresponds to a peak absorption depth for infrared (IR) radiation in the structure 10. An IR photodiode 18 is accordingly formed at the junction 16.

A thin film optical filter 20 may be provided above the region 14. Filter 20 may be configured to substantially block or attenuate visible light wavelengths, while substantially passing at least some IR wavelengths. The filter 20 may therefore be referred to as an IR pass filter. Overlying the filter 20, if present, is a region or layer 22 of the first conductivity type (e.g., a P-doped region), to form a junction 24. The junction 24 is at a depth in the structure 10 that substantially corresponds to a peak absorption depth for red light in the structure 10. A red photodiode 26 is accordingly formed at the junction 24.

Overlying the region 22 is a region or layer 28 of the second conductivity type (e.g., an N-doped region), to form a junction 30. The junction 30 is at a depth in the structure 10 that substantially corresponds to a peak absorption depth for green light in the structure 10. A green photodiode 32 is accordingly formed at the junction 30. Overlying the region 28 is a region or layer 34 of the first conductivity type (e.g., a P-doped region), to form a junction 36. The junction 36 is at a depth in the structure 10 that substantially corresponds to a peak absorption depth for blue light in the structure 10. A blue photodiode 38 is accordingly formed at the junction 36.

In some embodiments, a thin film optical filter 40 may be provided above the region 34. The filter 40 may be configured to substantially pass light wavelengths in the visible band while substantially blocking or attenuating most or all IR radiation except for IR at and/or near a certain wavelength (the "notch wavelength"). The filter 40 substantially passes IR radiation that is at and/or near the notch wavelength, and may therefore be referred to as an IR notch filter.

The sensing structure thus includes R, G and B photodiodes stacked above an IR photodiode. The sensing structure shown in FIG. 1 may correspond to a single pixel in a pixel imaging array that, in some embodiments, may be used to capture both color and depth information from an image formed on the pixel imaging array.

In some embodiments, the junction 36 of the blue photodiode 38 may be at a depth in the range of about 0.2 to 0.5 microns (e.g., at about 0.2 microns), the junction 30 of the green photodiode 32 may be at a depth in the range of about 0.5 to 1.5 microns (e.g., at about 0.6 microns), the junction 24 of the red photodiode 26 may be at a depth in the range of about 1.5 to 3.0 microns (e.g., at about 2.0 microns), and the junction 16 of the IR photodiode 18 may be at any suitable depth for capturing IR radiation. From the foregoing, it will be appreciated that FIG. 1 (like other similar drawings to follow) is not necessarily drawn to scale.

Instead of forming the regions 14, 22, 28 and 34 as, respectively, N-, P-, N- and P-doped regions on a P-substrate, the sensing structure may alternatively be formed by a stack of P-, N-, P-, and N-doped regions on an N substrate. As another alternative, schematically illustrated in FIG. 2, the substrate 12 may be of a P-type and an additional N-doped region or layer 42 may be present, below the IR sensitive region 14, which may be P-doped. In such embodiments, the R, G, B sensitive regions 22, 24, 34 may respectively be N-, P- and N-doped to provide a stacked RGB sensor of the kind disclosed in U.S. Pat. No. 5,965,875. An advantage of such an embodiment may be use of known triple well fabrication techniques of the kind described in the '875 patent in the formation of the stacked RGB sensor. In this embodiment, the junction 44 formed by the regions 42 and 14 may be allowed to remain inactive.

In other alternative embodiments, schematically illustrated in FIG. 3, a sensing structure 10a includes two IR sensitive photodiodes 18a and 46 stacked below the RGB photodiodes 26, 32, 38. More specifically, on a substrate of a first conductivity type, a layer or region 48 of a second conductivity type is formed to produce a junction 50 at a depth in the structure 10a that substantially corresponds to a peak absorption depth of a first IR wavelength in the structure 10a. The first IR photodiode 46 is accordingly formed at the junction 50. The next region 14a is of the first conductivity type to form a junction 16a at a depth in the structure 10a that substantially corresponds to a peak absorption depth of a second IR wavelength in the structure 10a, with the second IR wavelength being shorter than the first IR wavelength. Consequently, the second IR photodiode 18a is formed at the junction 16a. The regions 22, 28 and 34 may then be of the second conductivity type, the first conductivity type and the second conductivity type, respectively. For example, the substrate 12 may be P-type, the region 48 may be N-doped, the region 14a may be P-doped, and the regions 22, 28 and 34 may be N-doped, P-doped and N-doped respectively, as in the embodiment shown in FIG. 2.

It will be recognized that the second IR photodiode 18a is at least partially superimposed on the first IR photodiode 46, the red photodiode 26 is at least partially superimposed on the second IR photodiode 18a, the green photodiode 32 is at least partially superimposed on the red photodiode 26, and the blue photodiode 38 is at least partially superimposed on the green photodiode 32. Any one of the sensing structures illustrated in FIGS. 1–3 may be employed as a pixel sensor in a pixel imaging array as described below.

Figure 3:
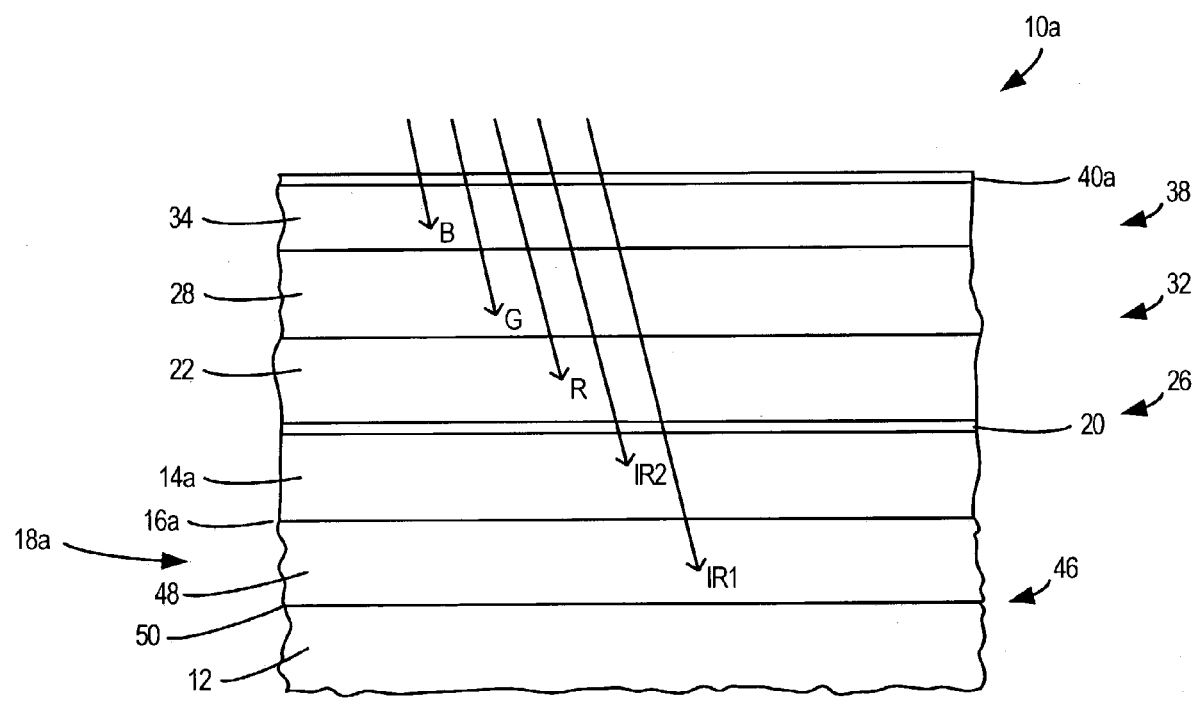
FIG. 3 is a schematic cross-sectional view of a visible and infrared radiation sensing structure according to still some other embodiments.

In embodiments according to FIG. 3, the optical filter 40a superimposed at the top of the sensing structure 10a may be arranged as a "dual IR notch" filter. That is, the filter 40a may pass visible radiation and IR radiation at two notch wavelengths, while substantially blocking or attenuating other IR radiation.

Figure 4:
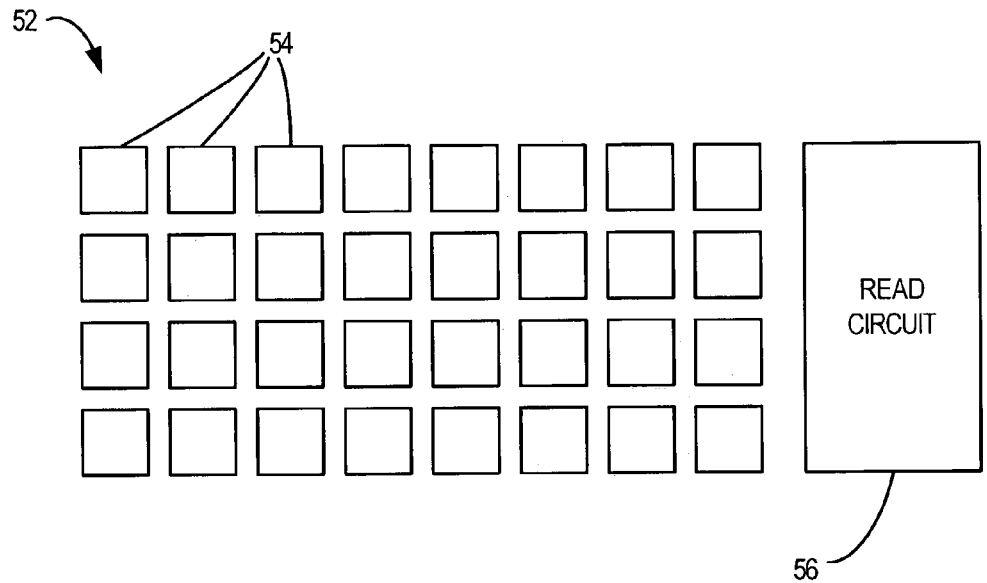
FIG. 4 is a diagram illustrating a pixel imaging array according to some embodiments.

FIG. 4 is a schematic plan view of a pixel imaging array 52 provided according to some embodiments. The array 52 includes pixel sensors 54 arranged in rows and columns. The pixel sensors 54 may each include a sensing structure of the type described above in connection with FIG. 1, or of the type described above in connection with FIG. 2, or of the type described above in connection with FIG. 3. Although the pixel sensors 54 are shown for the sake of illustration as forming only four rows and eight columns, it should be understood that, in some embodiments, a pixel imaging array may include hundreds or thousands of rows and hundreds or thousands of columns of pixel sensors.

The pixel imaging array 52 also includes a read circuit 56 which is associated with the pixel sensors 54 to generate and read out color and depth signals from the respective sensing structures of the pixel sensors. Although the read circuit 56 is shown as separate from the pixel sensors 54, it should be understood that in accordance with conventional practices portions of the read circuit 56 may be intermingled with the pixel sensors 54 to form so-called "active pixels". Each active pixel may comprise red, green, blue and IR photodiodes and transistors or other circuit elements (not shown) that are associated with each of the photodiodes and were formed on the substrate at the same time as the diodes. Examples of active RGB pixels are shown in U.S. Pat. No. 5,965,875, which was mentioned above.

Figure 5:
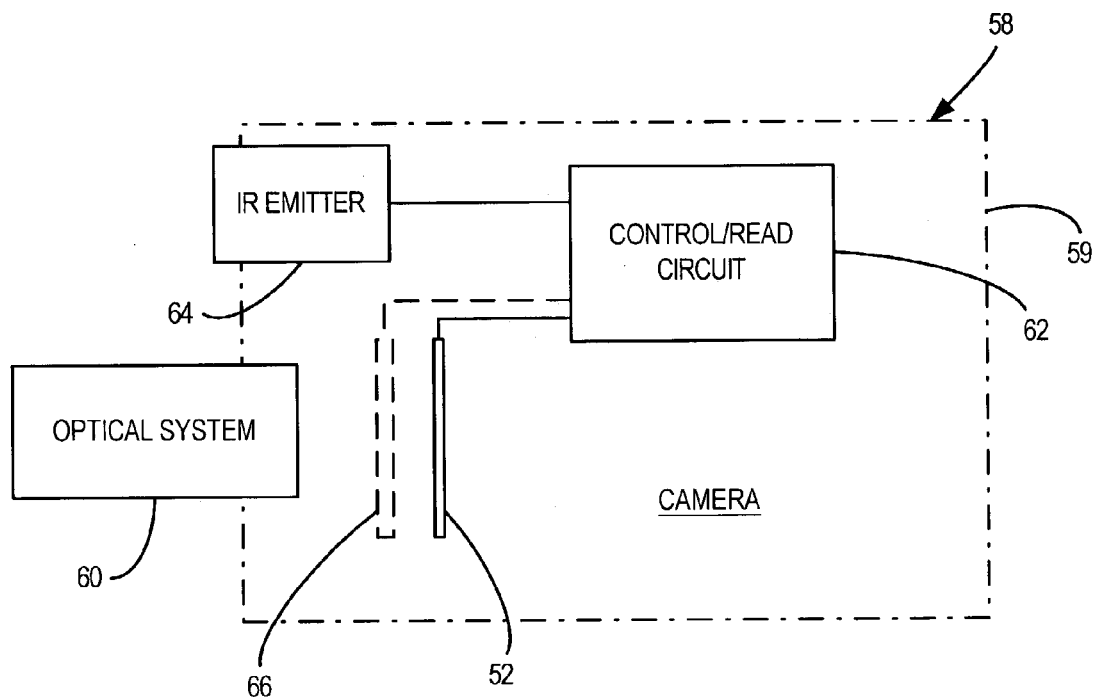
FIG. 5 is a diagram illustrating a color and depth information camera according to some embodiments.

FIG. 5 is a diagram that schematically illustrates a camera 58 according to some embodiments. The camera 58 incorporates a pixel imaging array 52 that may be of the type shown in FIG. 4. The camera 58 may also include a housing 59. The pixel imaging array 52 may be mounted in the housing 59 which may support an optical system 60 configured to form an image of visible and IR radiation on the pixel imaging array 52. The camera 58 may also include a control/read circuit 62 which is coupled to the pixel imaging array 52. The control/read circuit 62 may be considered to include the read circuit 56 (FIG. 4) associated with the pixel imaging array 52.

Continuing to refer to FIG. 5, the camera 58 also includes an IR emitter 64 which is coupled to the control/read circuit 62 and serves as an IR radiation source. The IR emitter 64 may include, for example, one or more IR LEDs, which are not separately shown. In some embodiments, the IR emitter may be selected to emit IR radiation at a single wavelength such as 830 nm, 880 nm or 940 nm. These wavelengths of IR radiation tend to be absent from operating environments because of absorption by ambient water vapor in the atmosphere, and therefore are suitable for use in IR communication and other applications in which it is desirable to avoid interference from ambient IR radiation. Emitting devices which operate at one of these wavelengths are widely commercially available. The particular wavelength emitted by the IR emitter 64 may correspond to a notch wavelength of an IR notch filter 40 (FIG. 1) which is part of the pixel imaging array 52 of the camera 58.

In some embodiments, the camera 58 may also include a shutter 66 (shown in phantom), such as a gallium arsenide shutter, disposed within the housing 59 in the optical axis of the camera 58 between the optical system 60 and the pixel imaging array 52. (Although not indicated in the drawing, the optical system 60 may also be coupled to and under the control of the control/read circuit 62.)

The control/read circuit 62 operates to control the camera 58, and particularly the pixel imaging array 52 and the IR emitter 64, to generate a color video signal as well as depth information. The color video signal may be generated in the form of frames at regular frame intervals such as once every 1/30 of a second. The color video signal may be generated by reading the RGB photodiodes of the pixel sensors at the frame intervals. In the time periods in between generation of the color video frames, the control/read circuit 62 may control the IR emitter 64 to emit one or more pulses of single wavelength IR radiation to illuminate a scene captured by the optical system 60. The control/read circuit 62 may also control and read the pixel imaging array 52 (and may also control the shutter 66, if present) in timed relation with the pulses emitted from the IR emitter to generate depth information for the scene based on stimulation of the IR photodiodes of the pixel imaging array 52 by single wavelength IR radiation reflected by the scene from the IR pulses emitted by the IR emitter 64.

The operation of the camera 58 to generate depth information may be generally in accordance with conventional principles such as are employed in the "ZCam" product (or similar camera that senses depth through active lighting) referred to above, although the camera 58 differs from the ZCam by collecting reflected IR radiation from the scene by using IR photodiodes stacked with color photodiodes as described in connection with FIGS. 1–3. By contrast, the ZCam utilizes an IR sensing array that is separate from the color sensing array of a camera on which the ZCam is installed. In any event, operation of the camera 58 to generate depth information will now be briefly described. (Although the Zcam is discussed herein for the sake of concreteness, it will be understood by those who are skilled in the art, that the stacked color and depth sensing structure disclosed herein may be applied in any camera that employs active lighting to sense depth.) Operation of the camera to generate depth data in accordance with some embodiments relies on precise detection of the timing at which an IR pulse is reflected from the scene to the pixel imaging array. The length (elapsed time) of the pulse may be precisely controlled such that the distance interval for which depth information is to be found corresponds to half the distance traveled by the illuminating radiation (i.e., the single wavelength IR radiation) during the duration of the pulse. The result is a "radiation wall" that has double the thickness of the distance interval for which depth information is to be found. The distance interval may be considered to be defined between a near distance and a far distance.

Depth information is to be generated based on IR radiation from the pulse that is reflected from the scene to the camera. The reflected IR radiation is collected by the IR photodiodes of the pixel imaging array 52 during a "reading window". The timing of the reading window is defined either by operation of the shutter 66 (if present) or through electronic control of the timing of the reading process via the control/read circuit 62. If the reading window is to be defined by electronic control of the reading process, there may be associated with each IR photodiode suitable circuitry to allow charges generated by the IR photodiode to be shunted though another diode to a storage area. The latter method of defining the reading window may employ high speed switching but may be more sensitive to noise than controlling a shutter to define the reading window.

Given the near distance for the distance interval and the length of the IR pulse emitted by the IR emitter 64, the starting point in time for the reading window may be defined as occurring at the point at which the leading edge of the emitted IR pulse could have returned to the camera if reflected at the near distance, and the duration of the reading window may be defined as half the duration of the emitted IR pulse. Reading of the IR photodiodes, whether controlled by shutter or by electronic switching, occurs only during the reading window. Depth information is obtained for each pixel by comparing an amount of current integrated at the pixel based on the received IR radiation with a normalization amount for the pixel. Normalization is required to account for differences in absorption/reflection of the illuminating radiation among various portions of the scene. The normalization amount for each pixel may be obtained from a prior or subsequent IR pulse for which there is full integration (e.g., over a reading window of at least double the duration of the previously described reading window) of the currents from the IR photodiodes. Numerical depth data for each pixel may be generated by analog-to-digital converting the integrated and normalized depth information signal obtained for the pixel.

With this process, higher depth data values are obtained for pixels that correspond to nearer objects in the distance interval. The depth information may be displayed as a gray scale image in which nearer objects appear brighter than more distant objects. The depth information may be employed for depth-keying to allow for image segmentation, object isolation and insertion, and similar special effects, as is conventionally done utilizing the ZCam product. However, because the image sensors described herein include an integrated IR sensing capability, a combined color-depth camera may be provided at lower cost than the conventional combination of a studio video camera with ZCam add-on. Similarly, the stacked color and depth information sensor disclosed herein is cheaper and more accurate than other cameras that employ active lighting to sense depth, because adding separate depth detection pixels to an R,G,B array spatially degrades the existing R,G,B pixel pattern. Stacking the depth pixel with the red, green and blue pixels as disclosed herein saves space, and hence cost and also avoids the alignment problems that arise in an array of separate, R,G,B plus depth pixels. The image sensors illustrated in FIGS. 1–3 therefore may facilitate integration of depth sensing into low cost consumer and amateur camcorders or other low cost video camera devices. For example, an image sensor with IR capture capability according to one of FIGS. 1–3 may be included, with suitable IR emitter, in a low cost video camera employed as an input device for a personal computer, to aid the personal computer in performing functions such as audio-visual speech recognition and/or gesture recognition.

As another application of such a video camera, gesture recognition may be employed for control of a video game. In the gaming environment, a camera like that of FIG. 5 may also be used for so-called "avatar skinning" in which the player's facial expressions are mapped to a character in the virtual game world.

Depth data provided by a camera like that shown in FIG. 5 may also be employed to improve image data compression in camcorders or for video conferencing. For example, the depth information may be used to distinguish between foreground objects (e.g. people) and background, so that the foreground objects may be coded with high fidelity and the background may be coded with low fidelity, or even omitted from transmission in the case of video conferencing.

In biometric applications, a camera like that illustrated in FIG. 5 may be used to implement face recognition.

Figure 2:
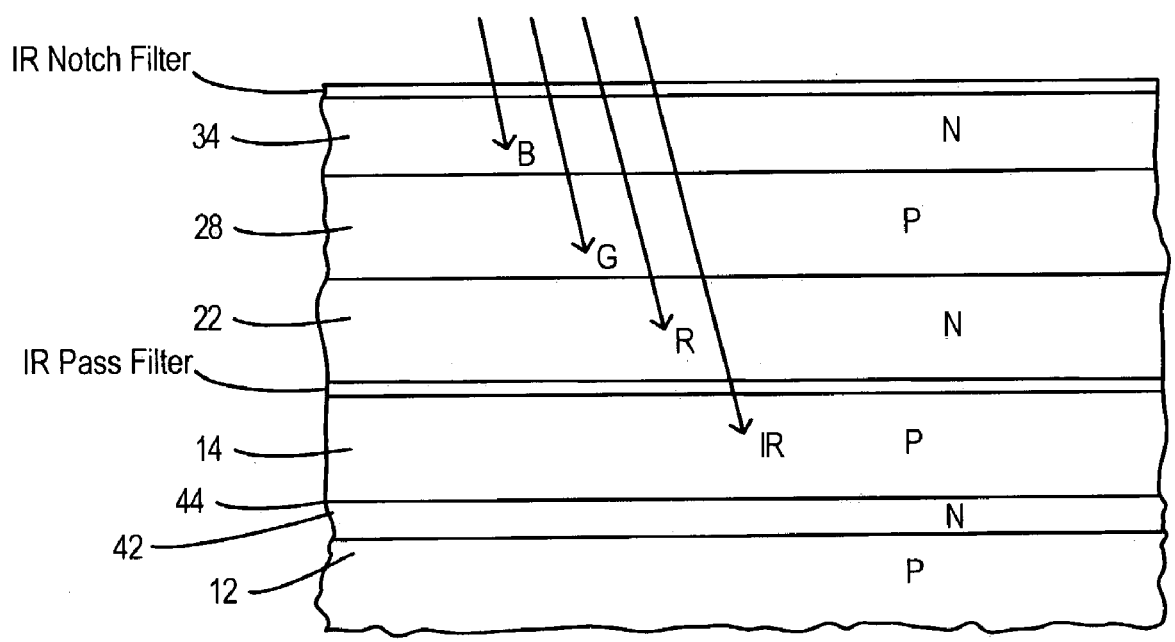
FIG. 2 is a schematic cross-sectional view of a visible and infrared radiation sensing structure according to some other embodiments.

The sensors illustrated in FIGS. 1–3 may be modified to replace the RGB photodiodes stacked above the IR photodiode or photodiodes with a single visible radiation photodiode stacked above the IR photodiode or photodiodes. Such sensors could be used to produce a visible radiation grayscale image plus depth information.

According to another possible modification of the sensors of FIGS. 1–3, the IR photodiodes need not have the same spatial resolution as the RGB photodiodes. For example, the IR photodiodes may have a lower spatial resolution than the RGB photodiodes by having the area of one IR photodiode generally correspond to the area of a two-by-two subarray of RGB photodiodes.

If the sensor structure shown in FIG. 3 (having two IR photodiodes stacked below RGB photodiodes) were utilized in the camera of FIG. 5, the IR emitter 64 may be modified so as to emit two different IR wavelengths in respective pulses. The two IR wavelengths emitted by the IR emitter may be selected to correspond to respective IR wavelengths to which the two IR photodiodes are sensitive. For example, the IR photodiodes 46 and 18*a* (referring to FIG. 3) may be respectively sensitive to 940 nm IR radiation and to 830 nm IR radiation. In that case, the IR emitter 64 may be arranged to emit pulses of 940 nm IR radiation and also to emit pulses of 830 nm IR radiation. Using the 940 nm IR pulses and the photodiodes 46, a suitable pulse length and reading window may be used to detect depth information in a first distance interval. Using the 830 nm IR pulses and the photodiodes 18*a*, a suitable pulse length and reading window may be used to detect depth information in a second distance interval that is different from the first distance interval. For example, the second distance interval may adjoin the first distance interval immediately behind the first distance interval. It will be understood that respective normalization procedures may be carried out for both the 940 nm and 830 nm depth detection functions.

In previous discussions herein of depth detection operations, it was assumed that depth information was gathered during a single reading window, subject to normalization. Alternatively, signals may be integrated over two or more reading windows (each window being defined after a respective pulse), to increase the dynamic range of the depth detection function of the camera.

In other alternative embodiments, depth detection may be performed for different distance intervals using pulses of a single IR wavelength. For this purpose different reading windows may be defined after respective pulses, which may differ in pulse length. Depth detection for two or more different distance intervals may be performed in a single interval between capture of succeeding color information frames, whether a single IR wavelength, or respective pulses of different wavelengths, are employed for depth detection in the different distance intervals.

In some embodiments, pixel imaging arrays having RGB photodiodes stacked above each IR photodiode may be distributed without the IR notch filter 40. A suitable thin film optical filter having a desired notch wavelength may be formed on the pixel image arrays after distribution when it is determined what illuminating IR wavelength is to be used. In other words, subsequent to initial distribution pixel imaging arrays may be customized with a suitable IR notch filter which matches the wavelength of IR illumination selected to be used with the pixel imaging arrays.

Although the camera of FIG. 5 has been described in connection with IR illumination using only one or two IR wavelengths, it is alternatively possible to use broader band IR illumination, particularly in indoor or other controlled environments in which ambient IR radiation is minimized or is not likely to interfere with depth detection and color imaging operation of the camera. In such cases the IR notch filter may be omitted.

In other alternative embodiments of the sensor structures of FIGS. 1–3, the IR pass filter 20 may be omitted if a sufficient proportion of visible radiation is absorbed in the layers 34, 28 and 22 such that not enough visible radiation reaches the IR sensing layer or layers to hinder accurate IR sensing.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A sensing structure, comprising:
   a first junction formed at a first depth in a semiconductor substrate to sense infrared radiation; and
   a second junction formed at a second depth in the semiconductor substrate to sense visible radiation, the second depth being less deep than the first depth, the second junction positioned to sense a red light component;
   a third junction formed at a third depth in the semiconductor substrate to sense a green light component; and
   a fourth junction formed at a fourth depth in the semiconductor substrate to sense a blue light component, the third depth being less deep than the second depth, and the fourth depth being less deep than the third depth; and
   an infrared-notch filter positioned above the fourth junction, and having a filter characteristic to substantially pass visible radiation and to substantially attenuate infrared radiation that has a wavelength that differs from a notch wavelength, and to substantially pass infrared radiation that has the notch wavelength.

2. The sensing structure of claim 1, wherein the notch wavelength is selected from the group consisting of 830 nm, 880 nm and 940 nm.

3. A pixel sensor, comprising:
   an infrared photodiode;
   a red photodiode at least partially superimposed on the infrared photodiode;
   a green photodiode at least partially superimposed on the red photodiode;
   a blue photodiode at least partially superimposed on the green photodiode; and
   an infrared-notch filter superimposed on the blue photodiode.

4. A pixel sensor, comprising:
   a first infrared photodiode to detect infrared radiation of a first wavelength;
   a second infrared diode, at least partially superimposed on the first infrared diode, to detect infrared radiation of a second wavelength that is shorter than the first wavelength;
   a red photodiode at least partially superimposed on the second infrared photodiode;
   a green photodiode at least partially superimposed on the red photodiode; and
   a blue photodiode at least partially superimposed on the green photodiode.

5. The pixel sensor of claim 4, further comprising an infrared-pass filter interposed between the second infrared photodiode and the red photodiode.

6. The pixel sensor of claim 4, further comprising a dual-infrared-notch filter superimposed on the blue photodiode.

7. A pixel imaging array, comprising a matrix of rows and columns of sensor structures, each sensor structure including:
   an infrared photodiode;
   a red photodiode at least partially superimposed on the infrared photodiode;
   a green photodiode at least partially superimposed on the red photodiode; and
   a blue photodiode at least partially superimposed on the green photodiode;
   and the pixel array further comprising;
   an infrared-notch filter superimposed on the matrix of sensor structures.

8. The pixel imaging array of claim 7, further comprising a read circuit to generate respective electrical signals from each of the photodiodes.

9. A color and depth information camera, comprising:
   a pixel imaging array that includes a matrix of rows and columns of sensor structures, each sensor structure including:
      an infrared photodiode;
      a red photodiode at least partially superimposed on the infrared photodiode;
      a green photodiode at least partially superimposed on the red photodiode; and
      a blue photodiode at least partially superimposed on the green photodiode;
   an optical system to form an image on the pixel imaging array;
   a control circuit coupled to the pixel imaging array; and
   an infrared radiation source coupled to the control circuit wherein the control circuit comprises:
      means for causing the infrared radiation source to emit an infrared pulse; and
      means for reading the infrared photodiodes in timed relation to the infrared pulse to obtain depth information from a scene illuminated by the infrared pulse.

10. A color and depth information camera, comprising:
    a pixel imaging array that includes a matrix of rows and columns of sensor structures, each sensor structure including:

an infrared photodiode;
a red photodiode at least partially superimposed on the infrared photodiode;
a green photodiode at least partially superimposed on the red photodiode; and
a blue photodiode at least partially superimposed on the green photodiode;
an optical system to form an image on the pixel imaging array;
a control circuit coupled to the pixel imaging array;
an infrared radiation source coupled to the control circuit; and
a shutter coupled to the control circuit and disposed in front of the pixel imaging array;
wherein the control circuit comprises:
   means for causing the infrared radiation source to emit an infrared pulse;
   means for opening and closing the shutter in timed relation to the infrared pulse; and
   means for reading the infrared diodes to obtain depth information from a scene illuminated by the infrared pulse.

11. A color and depth information camera, comprising:
a pixel imaging array that includes a matrix of rows and columns of sensor structures, each sensor structure including:
   an infrared photodiode;
   a red photodiode at least partially superimposed on the infrared photodiode;
   a green photodiode at least partially superimposed on the red photodiode; and
   a blue photodiode at least partially superimposed on the green photodiode;
an optical system to form an image on the pixel imaging array;
a control circuit coupled to the pixel imaging array; and
an infrared radiation source coupled to the control circuit;
wherein:
   the pixel imaging array includes an infrared-notch filter superimposed on the blue photo diodes, the filter having a characteristic to pass infrared radiation at a notch wavelength; and
   the infrared radiation source is operative to emit infrared radiation at the notch wavelength.

12. The camera of claim 11, wherein the notch wavelength is selected from the group consisting of 830 nm, 880 nm and 940 nm.

13. The sensing structure of claim 8, further comprising an infrared pass filter positioned above the first junction and below the second junction; the infrared pass filter having a filter characteristic to substantially attenuate visible radiation and to substantially pass infrared radiation.

14. The pixel sensor of claim 3, further comprising an infrared-pass filter interposed between the infrared photodiode and the red photodiode.

\* \* \* \* \*